United States Patent

Kano et al.

[15] 3,634,931

[45] Jan. 18, 1972

[54] METHOD FOR MANUFACTURING PRESSURE SENSITIVE SEMICONDUCTOR DEVICE

[72] Inventors: Gota Kano, Kyoto; Masami Yokozawa, Osaka; Tatsuo Kawasaki; Shohei Fujiwara; Hiromasa Hasegawa, all of Takatsuki-shi, all of Japan

[73] Assignee: Matsushita Electronics Corporation, Kadoma-shi, Osaka, Japan

[22] Filed: Dec. 9, 1969

[21] Appl. No.: 883,372

[30] Foreign Application Priority Data

Dec. 10, 1968 Japan ....................43/92173
Dec. 27, 1968 Japan ....................44/436

[52] U.S. Cl. ....................29/589, 148/1.5
[51] Int. Cl. ....................B01j 17/00, H01l 7/02
[58] Field of Search ....................29/589; 317/235 M, 235 U

[56] References Cited

UNITED STATES PATENTS

| | | | |
|---|---|---|---|
| 3,523,038 | 8/1970 | Sanders | 29/589 X |
| 3,460,005 | 8/1969 | Kanda et al. | 317/235 |
| 3,261,989 | 7/1966 | Weinstein | 317/235 |

*Primary Examiner*—John F. Campbell
*Assistant Examiner*—W. Tupman
*Attorney*—Stevens, Davis, Miller & Mosher

[57] ABSTRACT

In a semiconductor device with a four-layer structure having the so-called thyristor characteristic, when the control electrode for controlling its breakover voltage is constructed by the Schottky barrier and a means to apply a stress to the barrier, the breakover voltage of the said semiconductor device can be controlled by the stress. If this device is assembled in a circuit system, the circuit system can be set to either the "off" or "on" state, corresponding to the applied stress.

5 Claims, 3 Drawing Figures

GOTA KANO
MASAMI YOKOZAWA
TATSUO KAWASAKI
SHOHEI FUJIWARA
HIROMASA HASEGAWA
INVENTORS

BY
Stevens, Davis, Miller & Mosher
ATTORNEYS

METHOD FOR MANUFACTURING PRESSURE SENSITIVE SEMICONDUCTOR DEVICE

This invention relates to a solid state signal converter in which an electrical characteristic changes in response to a mechanical pressure signal; that is, it relates to a pressure-sensitive semiconductor device and more particularly to a negative resistance triode with a four-layer structure, for example, a PNPN-junction structure having a control electrode for controlling its breakover voltage.

It is well-known that, in a device having a semiconductor PN-junction or a rectifying junction formed by a contact between a semiconductor and a particular metal; that is, a so-called Schottky barrier junction, the rectifying characteristic of the device changes when a mechanical pressure is applied to said junction. That is, the device shows a pressure-sensitive characteristic. Especially, the said Schottky barrier junction device has good pressure response sensitivity.

On the other hand, a rectifying device with a four-layer structure, for example, a $P_1N_1P_2N_2$-junction structure such as the so-called thyristor is a device in which a control electrode for controlling its breakover voltage is constructed by an ohmic contact formed on a surface of the $N_1$-layer or $P_2$-layer. In such a device the control of the rectifying characteristic, in particular, the breakover voltage, was carried out by applying an electrical signal to said control electrode. Thus, in the past the control of said rectifying characteristic by means of a mechanical signal was not known.

The inventors of the present invention have provided a useful pressure-sensitive device by forming a Schottky barrier electrode on a surface of the $N_1$-layer of said four-layer structure rectifying device as the control electrode and applying a pressure to the electrode.

One object of the present invention is to provide a rectifying device with a four-layer structure having pressure-sensitive characteristics and another object is to provide an easy method of manufacturing such a four-layer structure device.

Now, a device of the present invention will be described in detail in conjunction with the accompanying drawings, in which.

Figure 1:
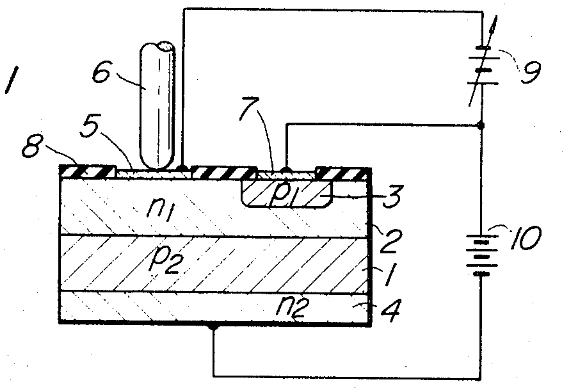
FIG. 1 is a sectional view illustrating the principle of construction of the present invention.

A device of the present invention is constructed, the principle of construction being as shown in FIG. 1, by forming an N-type region 2 to a P-type semiconductor substrate 1, making these two regions $N_1$-region and $P_2$-region respectively, forming junctions onto these regions respectively, that is, forming a P-type region 3 onto said N-type region 2 and an N-type region ($N_2$) 4 to the back surface of said P-type semiconductor substrate 1 ($P_2$-region), depositing a metal film 5 for forming a Schottky barrier to the surface portion of said N-type region 2 and providing a pressing means 6 for applying a stress to the Schottky barrier. Now, in the device shown in FIG. 1, $P_1$-region 3 is kept at ground potential through the ohmic metal electrode 7 applied to the region, said Schottky barrier electrode 5 is kept at a negative potential by a power source 9, and a bias voltage is applied to the main current circuit, that is, $P_1N_1P_2N_2$ by a power source 10 through an N-type region ($N_2$) 4 so that a junction between the $P_1$ region 3 and $N_1$ region 2 is forwardly biased and a junction between $P_2$-region 1 and $N_1$-region 2 is backwardly biased. In this state, if a pressure is applied to the Schottky barrier provided on the $N_1$-region 2 from the upper surface of the metal film 5 by the pressing means 6, the backward current flowing through said Schottky barrier, that is, the gate current of the thyristor operation increases and the device enters the conductive state. To describe this phenomenon in more detail, since the four-layer structure device of this embodiment is biased through the Schottky barrier, the quantity of injection of holes from $P_1$-region 3 to $N_1$-region 2 increases by the application of a pressure to said Schottky barrier, with the result that the device easily reaches the conductive state by said action together with the injection of electrons from the $N_2$-region 4. The marked difference between the device of the present invention and the conventional four-layer structure thyristor device is that the trigger signal is a mechanical signal of applied stress in the former.

Figure 2:
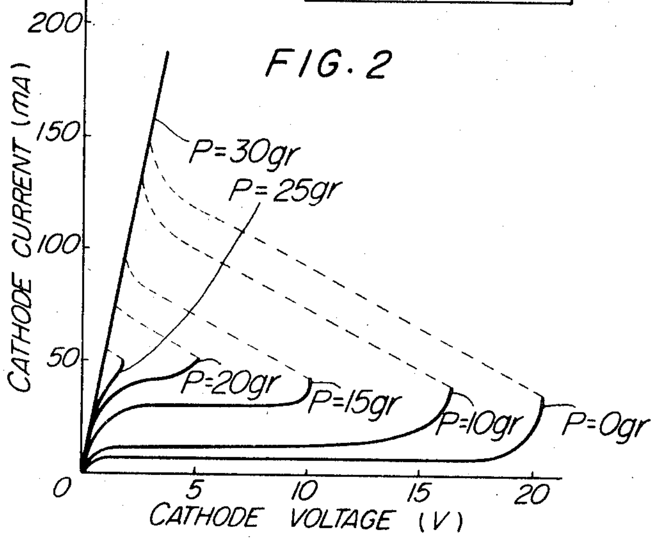
FIG. 2 is a representative characteristic of a device of the present invention.

FIG. 2 is a typical pressure-sensing characteristic obtained by an embodiment of the present invention, and in this device the breakover voltage decreases with the increase of pressure P applied to the pressing means 6.

A concrete example of a device of the present invention will be described in conjunction with FIG. 1.

A P-type silicon wafer 1 with resistivity of about 10 Ω—cm. and thickness of 150$\mu$ is prepared and a grown layer 2 with N-type conductivity is formed by the conventional epitaxial method. This grown layer 2 is formed by phosphorus doping to a thickness of 5$\mu$ and resistivity of 1.5 Ω—cm. Then an oxide film 8 is deposited on the surface of the epitaxial layer 2 to a thickness of about 5,000 A. by means of, for example, the low-temperature decomposition of siloxane, a predetermined window for diffusion is opened to the film, and boron is diffused to a depth of about 3$\mu$ through the window to form the P-type $P_1$-region 3. As to the N-type $N_2$-region 4 on the back surface of the P-type substrate 1, a phosphorus diffused layer with a thickness of about 5$\mu$ was formed. In the next, a window is opened in the oxide film 8 on said epitaxial N-type layer 2 and a molybdenum metal film 5 is deposited to a thickness of about 0.2$\mu$ by the sputtering method to form the Schottky barrier between the lower epitaxial layer 2 and the film. An ohmic electrode 7 comprised by an evaporated film of aluminum is provided on the surface of $P_1$-region 3, then an evaporated gold film (not shown) is applied on the upper surface of said molybdenum metal film 5 and said ohmic electrode 7 to improve the connection to the outer lead wire.

The semiconductor device of said construction is so constructed as a bias is applied between the $N_1$-and $P_1$-regions by the power source 9 that said $P_1N_1$-junction is forwardly biased (therefore the Schottky barrier junction is backwardly biased) through the metal electrode 5 of the Schottky barrier, and on the other hand a pressure P is applied to said Schottky barrier portion by a pressing means for applying a stress, for example, by a pressing member made from a sapphire needle of which the radius of its pointed end is 50$\mu$, applying a predetermined voltage between $P_1N_1P_2N_2$-by the power source 10 to make the junction between $P_1$-region 1 and $N_1$-region 2 backwardly bias. The characteristic curves shown in FIG. 2 are cathode current-pressure-sensing characteristic of said embodiment, wherein pressure P is represented by load weight (g). It can be seen from FIG. 2 that the breakover voltage decreases with increase in the stress applied to the Schottky barrier. If a device having such a characteristic is assembled in a circuit system, the circuit system can be set in an "off" or "on" state corresponding to a stress applied to said Schottky barrier. This device operates as a so-called electronic switch. Though, said embodiment has been described as a device with a PNPN-structure, the present invention can be applied to a device with a NPNP-structure in principle.

Next, a PNPN-structure device which can be manufactured more easily will be described as another embodiment together with its manufacturing method.

First, an epitaxial growth layer 12 including phosphorus about $5\times10^{16}$ atoms/cm.$^3$ as an impurity is formed to a thickness of about 5$\mu$ on a P-type silicon wafer 11 with a surface impurity density of about $1\times10^{16}$ atoms/cm.$^3$. Then a P-type region 13 having a desired shape is formed in said epitaxial growth layer 12 to a depth of about 4$\mu$ by selectively diffusing an acceptor impurity. Following that, an insulating film 14 (usually, a silicon oxide film) is deposited on the surface of the semiconductor, and windows for forming electrodes are opened in the film at predetermined portions on the surface of the said epitaxial layer 12 and the surface of the region 13, respectively, and each surface of the semiconductor is exposed. Then, a molybdenum metal film 15 is formed on the surface of said N-type epitaxial layer by means of the sputtering method to form the Schottky barrier there and an ohmic electrode 16 is formed on the surface of said P-type region 13 by evaporating, for example, a gold-chromium alloy of which the chromium content is 3–15 percent by weight. After that, the back surface of the said silicon wafer 11 is thermally fused to a stem base 18 interposing a gold-antimony alloy. A gold alloy including 1–5 percent by weight of antimony is suited as the gold-antimony alloy used in this thermally fusing process, and, for example, after evaporating said gold alloy onto said substrate (silicon wafer) 11 this substrate 11 is thermally fused to the stem 18. At that time, an alloy junction region 19 if formed on the back surface of the wafer 11. The most suitable temperature in order that the antimony in the alloy becomes the donor impurity, and the alloy junction region 19 serves as an electron emitting source in a forward direction is about from 390°–440° C.

Figure 3:
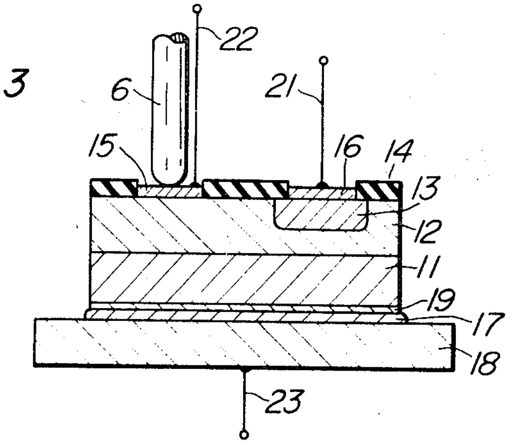
FIG. 3 is a sectional view of an embodiment of the present invention, which shows a construction body which can be provided by embodying the method of the present invention.

This semiconductor device has the silicon PNPN-structure by the above precess and when a stress is applied to the Schottky barrier provided on the surface of the N-type region 12 by means of a pressing member, for example, a sapphire needle of which the radius of its pointed end is $50\mu$, it showed a cathode current-pressure-sensing characteristic similar to the characteristic shown in FIG. 2. Reference numerals 21, 22 and 23 in FIG. 3 represent lead wires connected to the P-type region 13, the Schottky electrode 15 (or also called "pressure gate") and the alloy junction region 19, respectively. When the bias is applied to respective junction portions as is shown in FIG. 1, the device performs the thyristor operation.

Though this embodiment has been described as a PNPN-structure device, almost the same process can be applied in principle in the case of an NPNP-structure device. In this case, niobium, for example, is preferred in place of molybdenum as the metal film 15 to form the Schottky barrier, since the base is the P-type substrate, and when a gold-gallium alloy including 4–10 percent by weight of a gallium component is used as the thermally fused metal for forming the alloy junction electrode in place of the gold-antimony alloy the device can be easily produced, without changing the manufacturing process.

The present invention is summarized as below.

1. A pressure-sensitive semiconductor device characterized in that a four-layer structure such as PNPN or NPNP is constructed by forming semiconductor regions having opposite conductivity type one after another, a rectifying barrier junction comprised by a metal-semiconductor contact is formed on a surface portion of a region other than the outermost region in these four layers and a pressing means is applied to said rectifying barrier junction.

2. A method of manufacturing said pressure-sensitive semiconductor device having PNPN or NPNP four-layer structure characterized in that said rectifying barrier junction is formed on a surface of a region other than the outermost region and a surface of a region other than the outermost region and a surface of another region other than the outermost region is thermally fused to a stem base interposing a gold-antimony alloy or gold-gallium alloy and the outermost region is formed in this thermally fusing process.

A device of the present invention is a negative resistance triode with control electrode having pressure-sensitive characteristic, and as to the manufacturing method of the device the $N_2$-region can be formed simultaneously by the die bond process to fix the device to a stem base, therefore it is very easy and its utility is very large.

We claim:

1. A method of manufacturing a pressure-sensitive PNPN-semiconductor device comprising the steps of a. forming a semiconductor layer having a given conductivity type on a first surface of a semiconductor substrate of the opposite conductivity type, b. forming a semiconductor region of said opposite conductivity type in said layer, c. depositing a metal film on the surface of said layer to form a Schottky barrier, d. depositing an ohmic electrode on said semiconductor region, e. depositing an alloy selected from the group consisting of gold-antimony and gold-gallium on a second surface of said semiconductor substrate opposite said first surface, and f. thermally fusing the surface of a metal base to said second surface of said semiconductor substrate, said alloy being interposed between said substrate and metal base, a region of said given conductivity type being formed in the process of fusing said metal base to said semiconductor substrate.

2. A method of manufacturing a pressure-sensitive PNPN-semiconductor device as defined in claim 1 wherein said alloy is gold-antimony, said semiconductor substrate is P-type and an N-type region is formed during the fusing of said metal base to said semiconductor substrate.

3. A method of manufacturing a pressure sensitive semiconductor device according to claim 2, wherein the gold-antimony alloy includes 1–5 percent by weight of antimony.

4. A method of manufacturing a pressure-sensitive P-type semiconductor device as defined in claim 1 wherein said alloy is gold-gallium, said semiconductor substrate is N-type and a P-type region is formed during the fusing of said metal base to said semiconductor substrate.

5. A method of manufacturing a pressure sensitive semiconductor device according to claim 4, wherein the gold-gallium alloy includes 4–10 percent by weight of gallium.

* * * * *